US011360299B2

(12) United States Patent
Baran et al.

(10) Patent No.: US 11,360,299 B2
(45) Date of Patent: Jun. 14, 2022

(54) DISPLAY DEVICE WITH COMPACT SCANNING MIRROR

(71) Applicant: Microsoft Technology Licensing, LLC, Redmond, WA (US)

(72) Inventors: Utku Baran, Seattle, WA (US); Wyatt Owen Davis, Bothell, WA (US); Joshua Owen Miller, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 529 days.

(21) Appl. No.: 16/373,480

(22) Filed: Apr. 2, 2019

(65) Prior Publication Data

US 2020/0319451 A1    Oct. 8, 2020

(51) Int. Cl.
*G02B 26/08* (2006.01)
*G02B 26/10* (2006.01)
*G02B 26/12* (2006.01)

(52) U.S. Cl.
CPC ............ *G02B 26/08* (2013.01); *G02B 26/105* (2013.01)

(58) Field of Classification Search
CPC .. G02B 26/101; G02B 26/0833; G02B 26/85; G02B 26/0841; G02B 26/105; G02B 26/0858; G02B 27/0172; B81B 2203/0154; B81B 2203/0163; B81B 2203/04; B81B 3/0083; B81B 3/0086; B81B 3/0043
See application file for complete search history.

(56) References Cited

U.S. PATENT DOCUMENTS

| 6,629,461 | B2 | 10/2003 | Behin et al. |
| 6,888,662 | B2 | 5/2005 | Abu-Ageel |
| 7,232,071 | B2 | 6/2007 | Lewis et al. |
| 7,428,093 | B2 | 9/2008 | Tegreene et al. |
| 7,485,485 | B2 | 2/2009 | Linden et al. |
| 7,629,725 | B1 | 12/2009 | Knollenberg et al. |

(Continued)

FOREIGN PATENT DOCUMENTS

| EP | 1719012 B9 * | 6/2012 | ......... G02B 26/0833 |
| EP | 2857347 A1 | 4/2015 | |
| EP | 3343265 A1 | 7/2018 | |

OTHER PUBLICATIONS

"International Search Report and Written Opinion Issued in PCT Application No. PCT/US20/024743", dated Jul. 32, 2020, 12 Pages.

(Continued)

*Primary Examiner* — Darryl J Collins
*Assistant Examiner* — Tamara Y. Washington
(74) *Attorney, Agent, or Firm* — Alleman Hall Creasman & Tuttle LLP (57) ABSTRACT

A display device includes a light source, a support structure, and a scanning mirror system. The scanning mirror system includes a mirror, a first anchor located at a first lateral side of the scanning mirror system, a second anchor located at a second lateral side of the scanning mirror system, and a flexure. A first portion of the flexure extends from the first anchor toward a first longitudinal end and turns to meet a first end of the mirror. A second portion extends from the second anchor toward a second longitudinal end and turns to meet to a second end of the mirror opposite the first end. An actuator system is configured to actuate the flexure to thereby vary a scan angle of the mirror.

17 Claims, 8 Drawing Sheets

(56) References Cited

U.S. PATENT DOCUMENTS

| | | |
|---|---|---|
| 7,835,055 B2 | 11/2010 | Desai |
| 8,345,336 B2 | 1/2013 | Krastev et al. |
| 9,223,129 B2 | 12/2015 | Brown et al. |
| 10,310,253 B2* | 6/2019 | Carminati ............. B81B 3/0083 |
| 2005/0194867 A1* | 9/2005 | Kawakubo .......... H01L 41/0933 |
| | | 310/348 |
| 2013/0033732 A1 | 2/2013 | Davis et al. |
| 2016/0006372 A1 | 1/2016 | Elata et al. |
| 2018/0039074 A1 | 2/2018 | Oyama et al. |

OTHER PUBLICATIONS

Baran, et al., "High Frequency Torsional Mems Scanner for Displays", In IEEE 25th International Conference on Micro Electro Mechanical Systems, Jan. 29, 2012, pp. 636-639.

Holmstrom, et al., "MEMS Laser Scanners: A Review", In Journal of Microelectromechanical Systems, vol. 23, Issue 2, Apr. 2014, pp. 259-275.

Lee, et al., "LIDAR System using Indirect Time of Flight Method and MEMS Scanner for Distance Measurement", In IEEE International Conference on Optical MEMS and Nanophotonics, Jul. 31, 2016, pp. 1-2.

Baran, et al., "Video-rate Volumetric Optical Coherence Tomography-based Microangiography", In Journal of Optical Engineering, Issue 55, vol. 4, Apr. 26, 2016.

* cited by examiner

DISPLAY DEVICE WITH COMPACT SCANNING MIRROR

BACKGROUND

A display device may utilize a scanning mirror system to scan light from a light source to produce a viewable image.

SUMMARY

Examples are disclosed that relate to scanning mirror systems for display devices. One example provides a display device comprising a light source, a support structure, and a scanning mirror system. The scanning mirror system comprises a mirror, a first anchor located at a first lateral side of the scanning mirror system, a second anchor located at a second lateral side of the scanning mirror system, and a flexure. The flexure comprises a first portion extending from the first anchor toward a first longitudinal end of the scanning mirror system and turning to meet a first end of the mirror, and a second portion extending from the second anchor toward a second longitudinal end of the scanning mirror system and turning to meet to a second end of the mirror opposite the first end. The scanning mirror system further comprises an actuator system configured to actuate the flexure to thereby vary a scan angle of the mirror.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

In a scanning display system, light from a light source may be scanned by varying an angle of a scanning mirror while controlling light emitted from one or more light sources to produce a viewable image. Some scanning mirror systems are configured to scan at a resonant frequency of the mirror system. In such examples, the scanning mirror is coupled to an actuator via a flexure. The actuator drives the scanning mirror by applying torsional forces to the flexure, thereby twisting the flexure to vary the scan angle of the mirror. However, repeated strain experienced by the flexure over time may degrade the flexure and thus impact a lifetime of the overall scanning display system.

One approach to mitigating the effect of this strain is to strengthen the flexure by increasing the aspect ratio of the flexure, such as by increasing the width of the flexure relative to the flexure thickness. However, increasing a flexure aspect ratio may pose various disadvantages. For example, increasing the width of a flexure may increase the stiffness of the flexure. This may change the resonant frequency of a scanning mirror system design and necessitate other changes to maintain a desired resonant frequency, such as increasing a length of the flexure. However, greater flexure lengths may increase the overall size of a scanning mirror system, which may be undesirable for display devices in which a compact form factor is prioritized, such as head-mounted display (HMD) devices.

Figure 1:
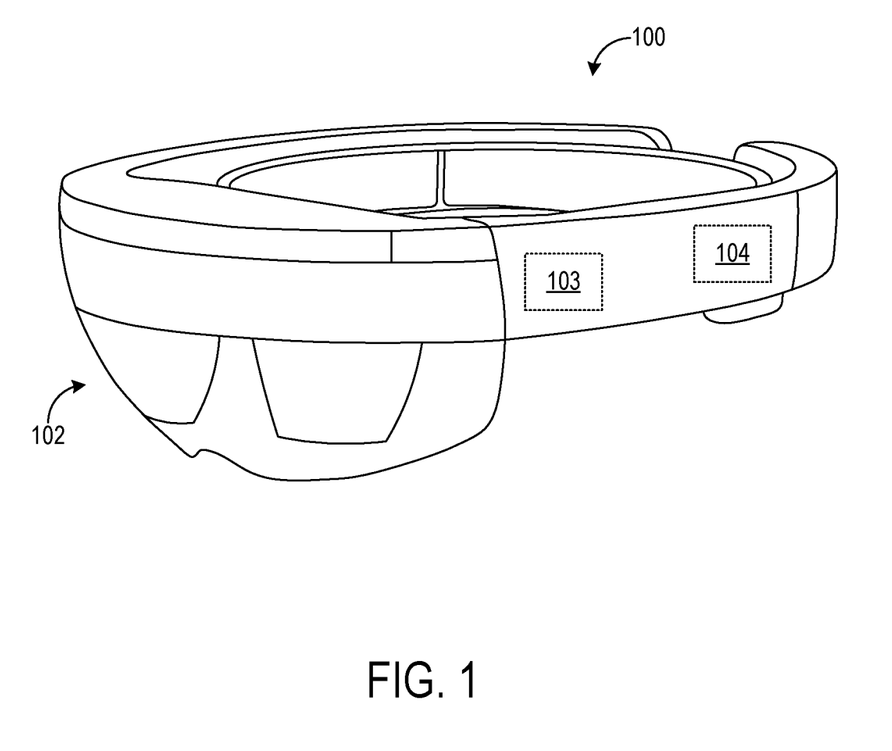
FIG. 1 shows an example display device that may utilize a scanning mirror system.

Accordingly, examples are disclosed that relate to a resonant scanning mirror system comprising a flexure having a compact geometry compared to other designs having similar resonant frequencies. The example scanning mirror systems disclosed herein may be implemented in any suitable display device. Examples include but are not limited to HMD devices and other near-eye display devices, as well as televisions, monitors, and mobile device displays. FIG. 1 shows an example HMD device 100 that may implement a scanning mirror system in accordance with the examples disclosed herein. HMD device 100 includes a display system configured to display near-eye imagery to a wearer. In some implementations, the display system comprises a display 102 that is substantially opaque, presenting virtual imagery as part of a virtual-reality experience in which a wearer of HMD device 100 is completely immersed in the virtual-reality experience. In other implementations, the display system comprises a display 102 that is at least partially transparent, allowing a user to view presented virtual imagery along with a real-world background viewable through the display to form an augmented reality experience, such as a mixed-reality experience. In some examples, the opacity of display 102 is adjustable (e.g. via a dimming filter), enabling the display to function both as a substantially opaque display for virtual-reality experiences and as a see-through display for augmented reality experiences.

The display system further includes a scanning mirror system 103 configured to scan light from a light source to thereby form virtual imagery viewable by a wearer of HMD device 100. HMD device 100 may comprise any suitable optical elements to display, via display 102, the virtual imagery produced by scanning mirror system 103, such as one or more light sources, waveguide, holographic optical elements, lenses, diffraction gratings, etc.

HMD device 100 further comprises a computing device 104 configured to perform various computing functions, including generating virtual imagery for display on display 102. Computing device 104 may include any suitable computing hardware, such as a logic subsystem comprising a processor and a storage subsystem. The logic subsystem may be configured to execute instructions stored on the storage subsystem to implement any suitable computing functions. In other examples, at least some computing functions may be performed off-board, e.g. via one or more network-accessible computing systems.

HMD device 100 may include various sensors to provide information to computing device 104. Such sensors may include one or more inward facing image sensors (e.g. for eye tracking), one or more outward facing image sensors, an inertial measurement unit (IMU), and one or more microphones (e.g. for receiving voice commands).

Figure 2:
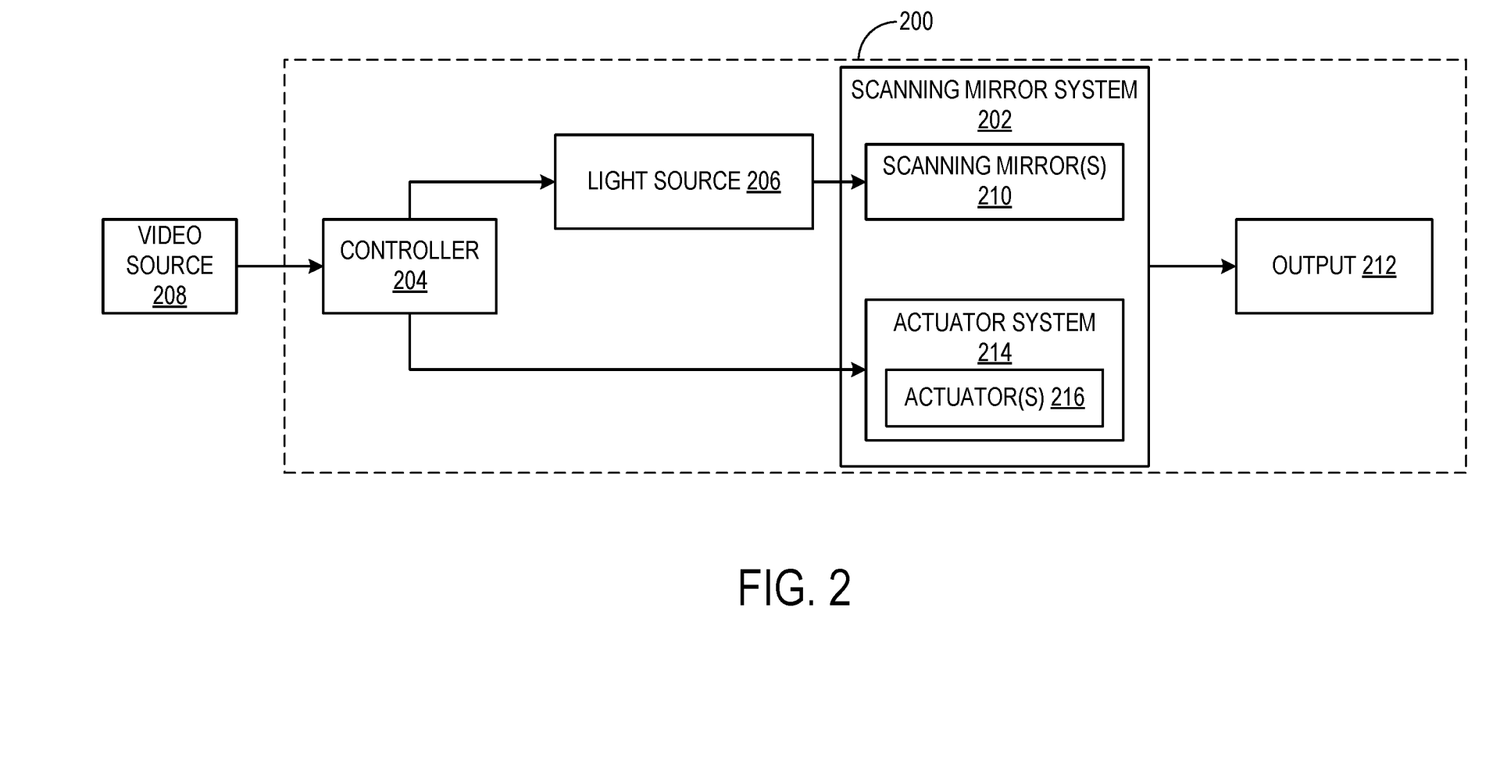
FIG. 2 shows a block diagram of an example display device that utilizes a scanning mirror system to form an image.

FIG. 2 schematically shows an example display device 200 including a scanning mirror system 202. The display system of HMD device 100 may implement aspects of display device 200, for example. Display device 200 includes a controller 204 operatively coupled to scanning mirror system 202 and to a light source 206. Controller 204 is configured to control light source 206 to emit light based on video image data received from a video source 208 (e.g. computing device 104). Light source 206 may include any suitable light-emitting elements, such as one or more lasers. Further, light source 206 may output light in any suitable wavelength ranges—e.g. red, green, and blue wavelength ranges that enable the production of color images. In other examples, light source 206 may output substantially monochromatic light.

Scanning mirror system 202 comprises one or more scanning mirrors 210 controllable to vary an angle at which light from light source 206 is reflected to thereby scan an image. In some examples, scanning mirror system 202 may include a single mirror configured to scan light in horizontal and vertical directions, while in other examples the scanning mirror system may include separate mirrors for scanning in the horizontal and vertical directions.

Light reflected by scanning mirror system 202 is directed toward an output 212 for display of a scanned image. Output 212 may take any suitable form, such as projection optics, waveguide optics, etc.

Scanning mirror system 202 comprises an actuator system 214 including one or more actuators 216 controllable to actuate scanning mirror(s) 210. As described below with reference to FIG. 3, actuator(s) 216 may actuate a scanning mirror 210 by driving a flexure supporting the scanning mirror. Actuator(s) 216 may assume any suitable form, including but not limited to piezoelectric, electrostatic, and electromagnetic forms.

Figure 3:
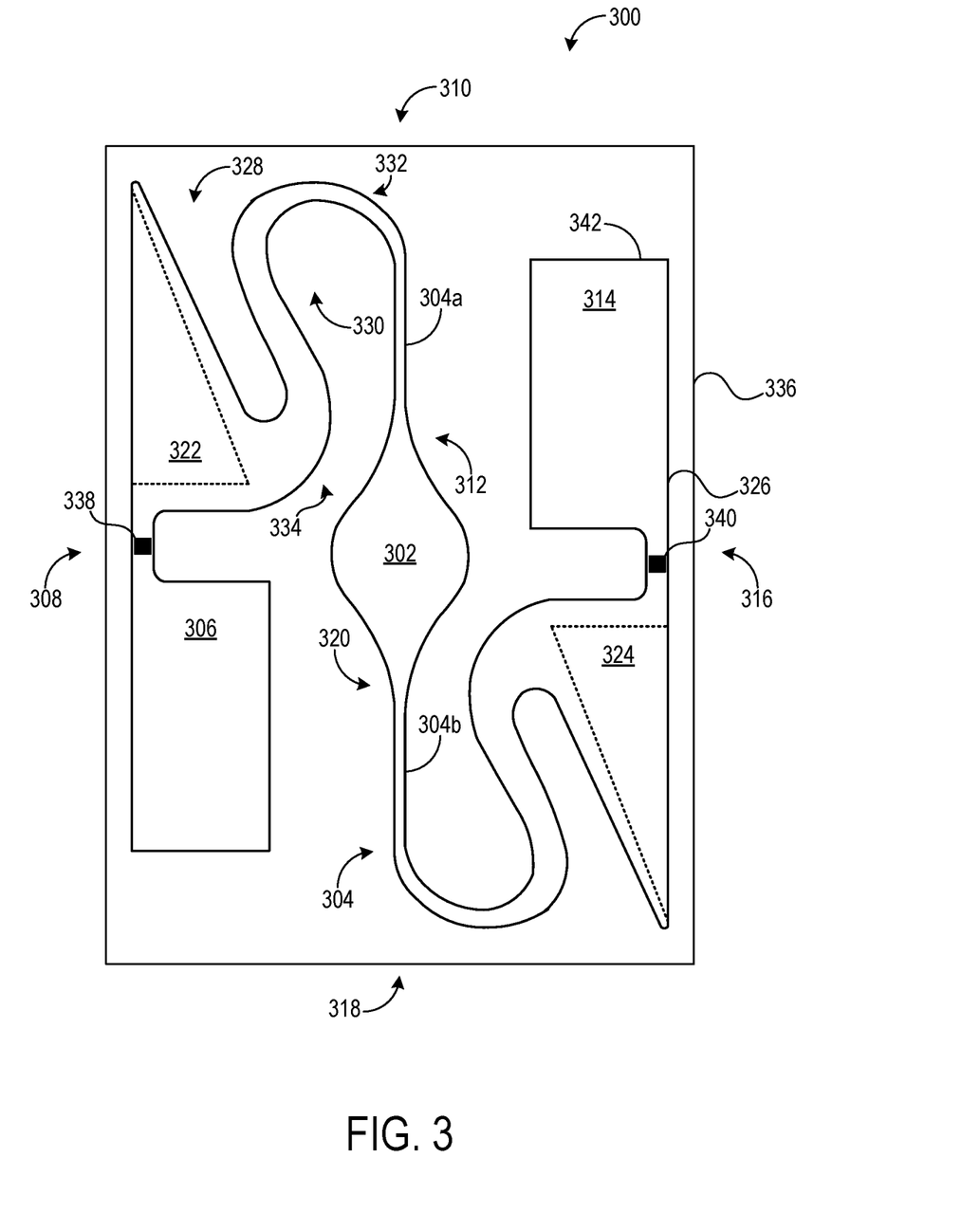
FIG. 3 shows an example scanning mirror system.

FIG. 3 shows an example scanning mirror system 300 comprising a scanning mirror 302 controllable to vary an angle at which light from a light source (e.g. light source 206) is reflected to thereby form a displayed image. Aspects of scanning mirror system 300 may be implemented in the display system of HMD device 100 and/or scanning mirror system 202, for example.

Mirror 302 is supported by a flexure 304 that includes a first portion 304a and a second portion 304b. First portion 304a extends from a first anchor 306, which is located at a first lateral side 308 of scanning mirror system 300, toward a first longitudinal end 310 of the scanning mirror system. First portion 304a then turns to meet a first end 312 of mirror 302. Second portion 304b extends from a second anchor 314, which is located at a second lateral side 316 of scanning mirror system 300 opposite first lateral side 308, toward a second longitudinal end 318 of scanning mirror system 300. Second portion 304b then turns to meet a second end 320 of mirror 302. The terms "turns", "turned", "curves", "curved", and the like as used herein indicate any geometrical arrangement in which the flexure changes direction along a path between the anchor and the mirror, including smoothly curved geometries, angular geometries, and combinations thereof. Further, as shown in FIG. 3, flexure 304 may comprise a unitary structure (e.g. including the longitudinal portions that meet mirror 302 and the curved portions extending from the anchors). In some examples, flexure 304 may be contiguous with the anchors from which the flexure extends (e.g. the flexure and anchors may be unitary). In contrast, other scanning mirror systems may include one or more arms that connect an actuator system and/or anchor to a flexure supporting a scanning mirror.

Scanning mirror system 300 further includes an actuator system configured to vary the scan angle of mirror 302 by generating torsional forces that are imparted to flexure 304 to rotate mirror 302. In the depicted example, the actuator system includes two actuators arranged along respective portions of flexure 304. The depicted actuators take the form of thin films of a piezoelectric material, but in other examples any other suitable actuation mechanism may be used, including electrostatic and electromagnetic actuators. More specifically, the depicted actuator system includes a first actuator 322 configured to actuate first portion 304a of flexure 304, and a second actuator 324 configured to actuate second portion 304b of the flexure, as described in more detail below with reference to FIGS. 4A-4B. While shown as comprising substantially triangular shapes, first and second actuators 322 and 324 may comprise any other suitable geometries in other examples.

First and second anchors 306 and 314 may be configured to function as pivots to enable the first and second flexure portions to move in a lever-like manner in response to actuation. To this end, first and second anchors 306 and 314 may be fixed to an underlying support structure, as described in further detail below. By moving in a lever-like manner, first and second flexure portions 304a and 304b may mechanically amplify motion created by the actuator system, thereby achieving a mechanical advantage that results in amplified motion of the mirror 302.

The geometry of each of flexure portion defines a respective first gap between that flexure portion and a corresponding actuator, where the gap extends inwardly from an outer perimeter 326 of scanning mirror system 300. This is illustrated with reference to first flexure portion 304a as example first gap 328 extending inwardly from outer perimeter 326. Further, each flexure portion defines a second gap separating laterally adjacent sections of that flexure portion, illustrated for the first flexure portion as second gap 330.

In the example depicted in FIG. 3, the geometry of each flexure portion comprises a meandering, serpentine shape comprising one or more curves. For example, the first flexure portion includes a first curve 332 and a second curve 334. In depicted example, the curvatures of the flexure portions vary in a continuous manner. However, other flexure geometries may be used in other examples. For example, the flexure portions may comprise one or more angular portions, or a combination of continuous and angled variations.

The meandering geometry of first and second flexure portions 304a and 304b may permit a greater flexure length to be implemented in a compact space relative to other geometries. As seen in FIG. 3, a significant fraction of the length of each flexure portion extends toward first and second longitudinal ends 310 and 318 of scanning mirror system 300 and within outer perimeter 326 of the scanning mirror system prior to turning toward the mirror. The greater flexure length afforded by the meandering geometry may allow flexure 304 to provide greater mechanical amplification to motion of mirror 302 compared to designs in which the flexures extend linearly from a support structure (e.g. arms or a frame that link an end of a flexure to both lateral sides of a mirror system). The greater flexure length may also help to reduce an overall strain experienced by flexure 304 during actuation, as forces received by the flexure can be distributed throughout such greater length. Further, the greater length may allow flexure 304 to be configured with a relatively high aspect ratio of flexure width to flexure thickness to thereby increase the strength of the flexure, without unduly expanding the size of scanning mirror system 300 as described above, while supporting desired resonant frequencies of the scanning mirror system.

As described above, anchors 306 and 314 may function as pivots for the arms by being fixed to an underlying support structure, such as a circuit board 336. Circuit board 336 may include drive circuitry configured to drive the actuator system. Circuit board 336 may implement at least a portion of controller 204, in some examples.

Any suitable mechanism may be employed to couple anchors 306 and 314 to circuit board 336. In some examples, anchors 306 and 314 are attached to circuit board 336 via wire bonding, which both mechanically couples the scanning mirror system to the circuit board and also forms electrical connections to actuators and strain sensors on the scanning mirror system. While anchors 306 and 314 are depicted as generally rectangular regions in FIG. 3, the anchors may exhibit any other suitable geometry in other examples.

Circuit board 336 may include circuitry for receiving output from a sensor system configured to sense strain in scanning mirror system 300. Output from the sensor system may be used as a feedback signal in controlling the actuator system, for example. In the example depicted in FIG. 3, the sensor system includes a first strain sensor 338 located between first anchor 306 and first actuator 322, and a second strain sensor 340 located between second anchor 314 and second actuator 324. First and second strain sensors 338 and 340 may be arranged at any other suitable location in scanning mirror system 300 in other examples. First and second strain sensors 338 and 340 are configured to sense strain of flexure 304 by sensing strain experienced at their respective locations between the corresponding actuators and anchors. As first and second anchors 306 and 314 may experience reduced strain relative to other regions of scanning mirror system 300 during actuation of mirror 302 by virtue of their coupling to circuit board 346, first and second strain sensors 338 and 340 may also experience less strain relative to other placements in other regions of scanning mirror system 300. This may help to increase the operational lifetime of the strain sensors and thus the operational lifetime of scanning mirror system 300.

Scanning mirror system 300 may be formed in any suitable manner. In some examples, the flexure, mirror, and anchors are formed from a single substrate 342 by a suitable patterning method (e.g. laser cutting, physical or chemical etching, etc.). In this case, the mirror, anchors, and flexure may be unitary. The actuator system and/or sensor system may comprise one or more layers disposed on substrate 342. As one example in which the actuator system and/or sensor system respectively include piezoelectric actuator(s) and piezoelectric sensor(s), the actuator(s) and/or sensor(s) may comprise a first electrode layer, a layer including a piezoelectric material, and a second electrode layer. In this arrangement, a voltage may be applied across the two electrode layers to cause a change in the lattice of the piezoelectric material, resulting in mechanical forces that actuate mirror 302. The mirror actuation induces strain in the piezoelectric material of one or more sensors, thereby inducing a voltage across the two electrode layers of each sensor and allowing the sensing of strain in flexure 304. In some examples, all of the sensors and actuators may be formed via common deposition steps using suitable patterning processes. Electrical connections to and from the sensors and actuators may be formed from a same material as the electrode layers, and may be deposited in a same process as one or more electrode layers of the sensors and/or actuators. In yet further examples, the actuator system be configured as a thin-film piezoelectric actuator system, where first actuator 322 and second actuator 324 comprise patterned portions of a common thin film.

Figure 4A:
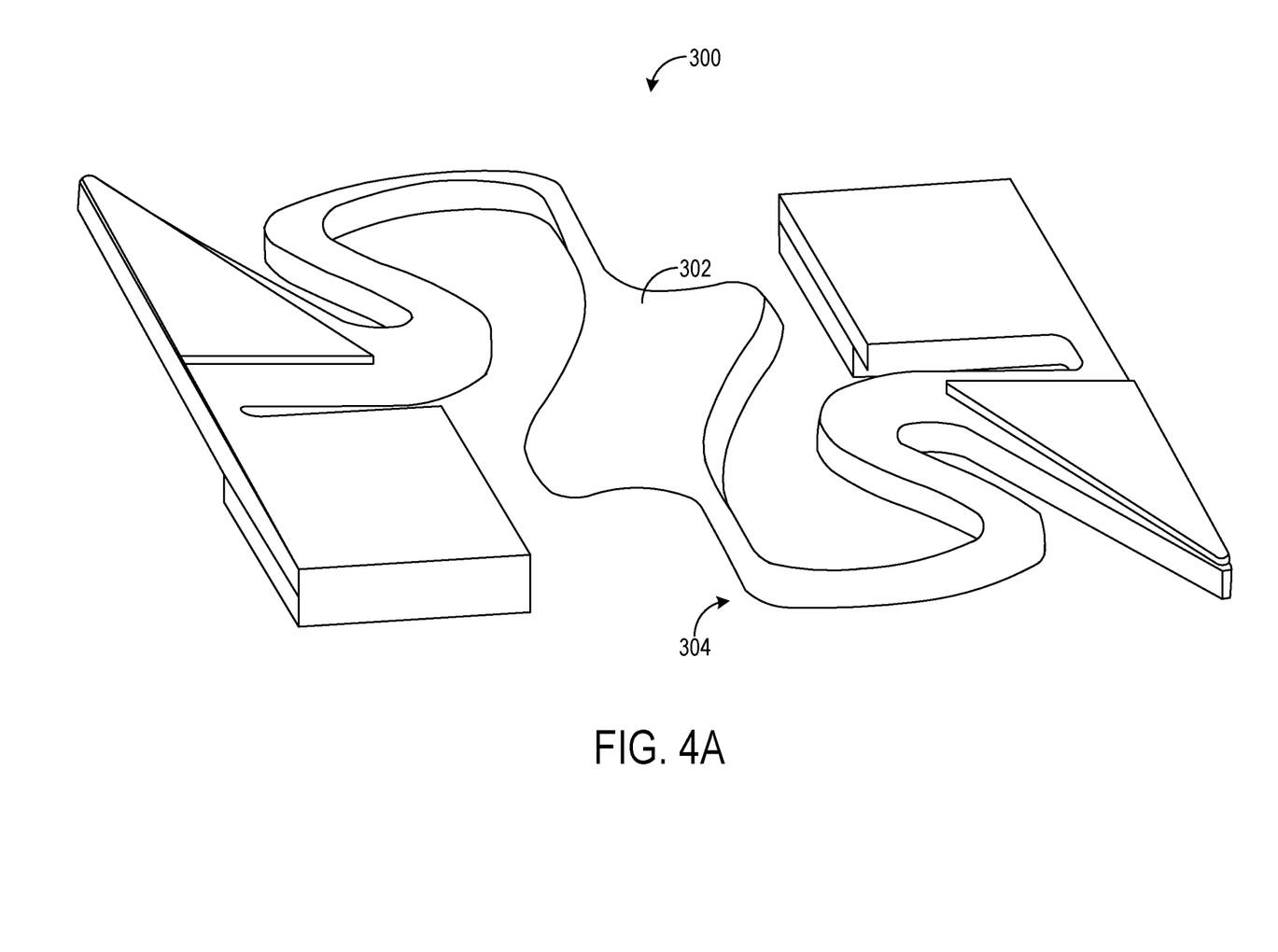
FIGS. 4A-4B illustrate actuation of the scanning mirror system of FIG. 3.
Figure 4B:
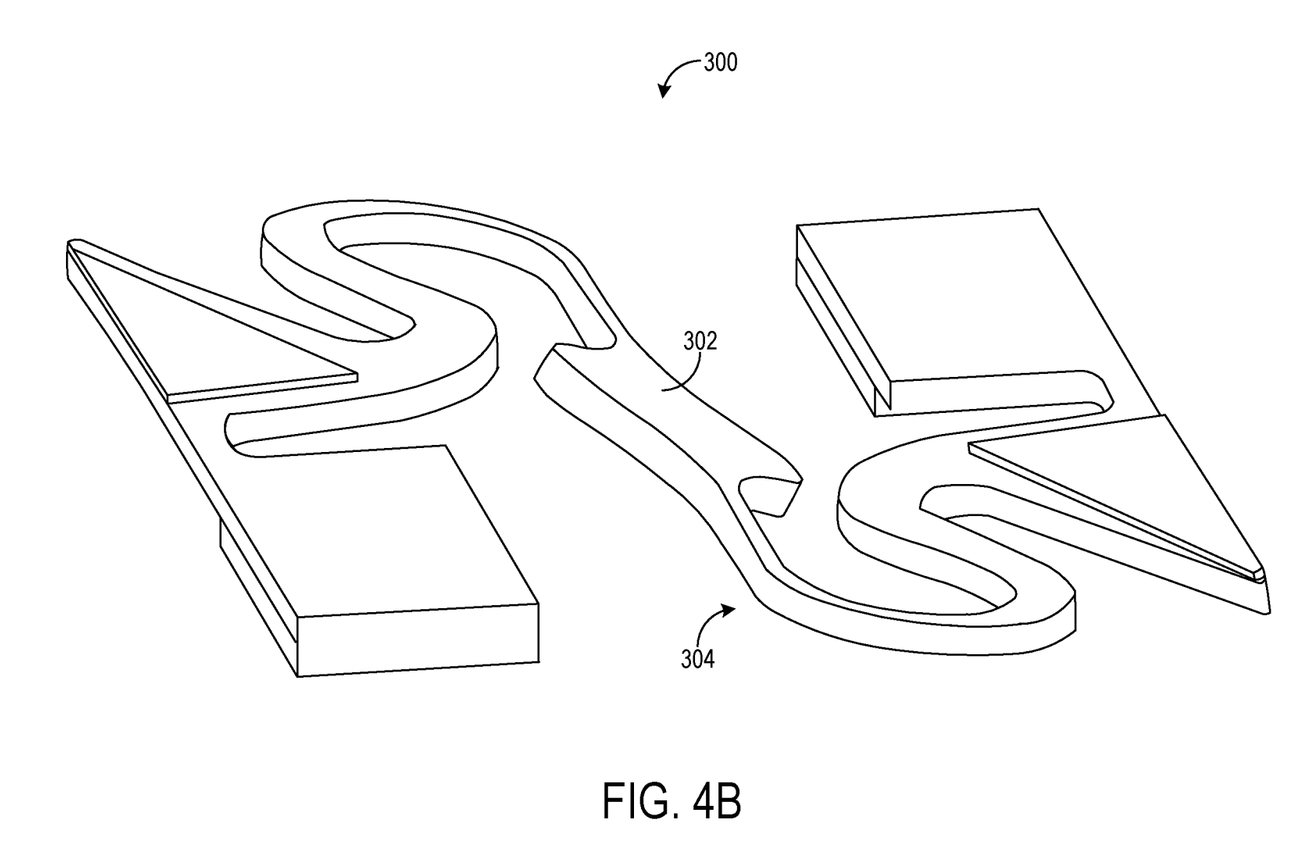

FIGS. 4A-4B illustrate actuation of scanning mirror system 300. In this example, mirror 302 scans light in a scanning direction through rotation of flexure 304. To rotate flexure 304, suitable voltages are applied across the actuators (wherein a different voltage may be applied across each actuator depending upon a desired mirror position), thereby causing the piezoelectric actuator materials to change shape. The resulting strain causes motion of the substrate, which is amplified by flexure 304 and imparted to mirror 302. FIG. 4A depicts mirror 302 oriented at a first scan angle, while FIG. 4B depicts the mirror oriented at a second angle rotationally opposite the first angle. As may be seen from FIGS. 4A and 4B, the mechanical amplification of motion of mirror 302 via flexure 304 is such that the angle of the mirror is greater than the respective angles of the flexure portions.

In some examples, the axis of rotation of mirror 302 may be tilted relative to the longitudinal axis of scanning mirror system 300. Where mirror 302 is configured to scan light in a desired direction, such tilt may result in the mirror scanning light in an actual direction that is misaligned with the desired direction. For example, mirror 302 may be configured to scan in a horizontal direction, while an actual scan direction of the mirror may form an oblique angle relative to the horizontal direction. To compensate such misalignment in the scanning direction of mirror 302, an elliptically shaped mirror may be used instead.

Figure 5:
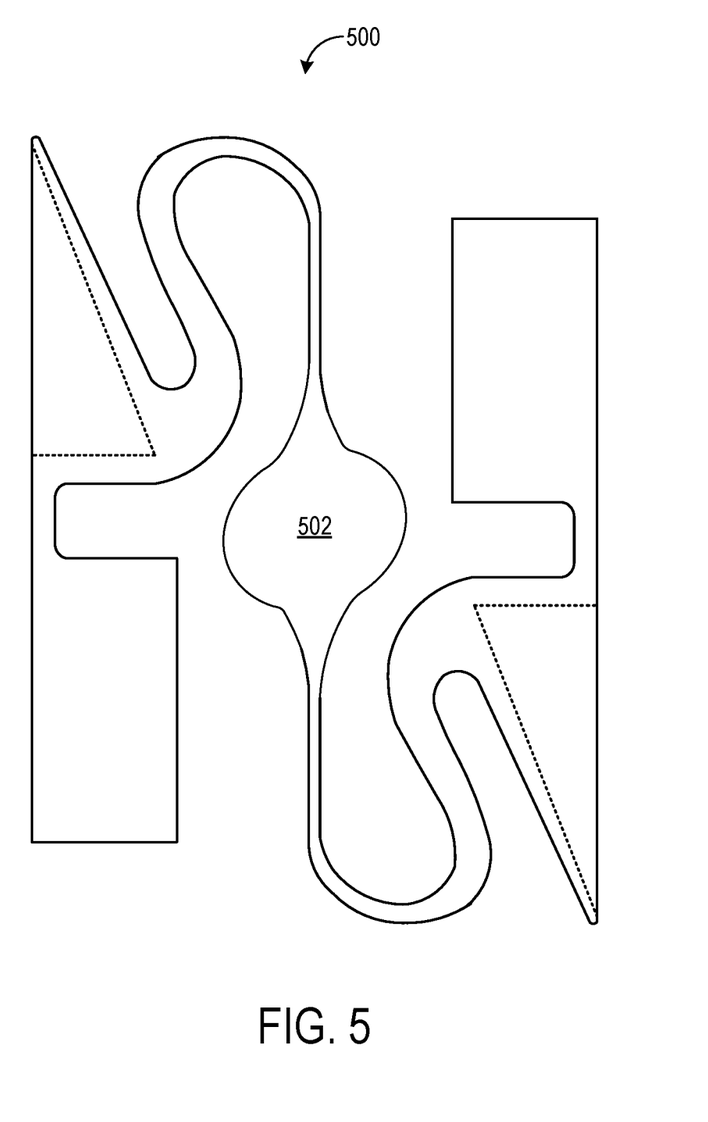
FIG. 5 shows another example scanning mirror system.

FIG. 5 shows an example scanning mirror system 500 including a mirror 502 comprising an elliptical shape. In this example, the longitudinal axis of mirror 502 is oriented at an oblique angle relative to the longitudinal axis of scanning mirror system 300. This orientation may result in the scan direction of mirror 502 being substantially aligned with a desired scan direction (e.g. a horizontal line scan direction).

Figure 6:
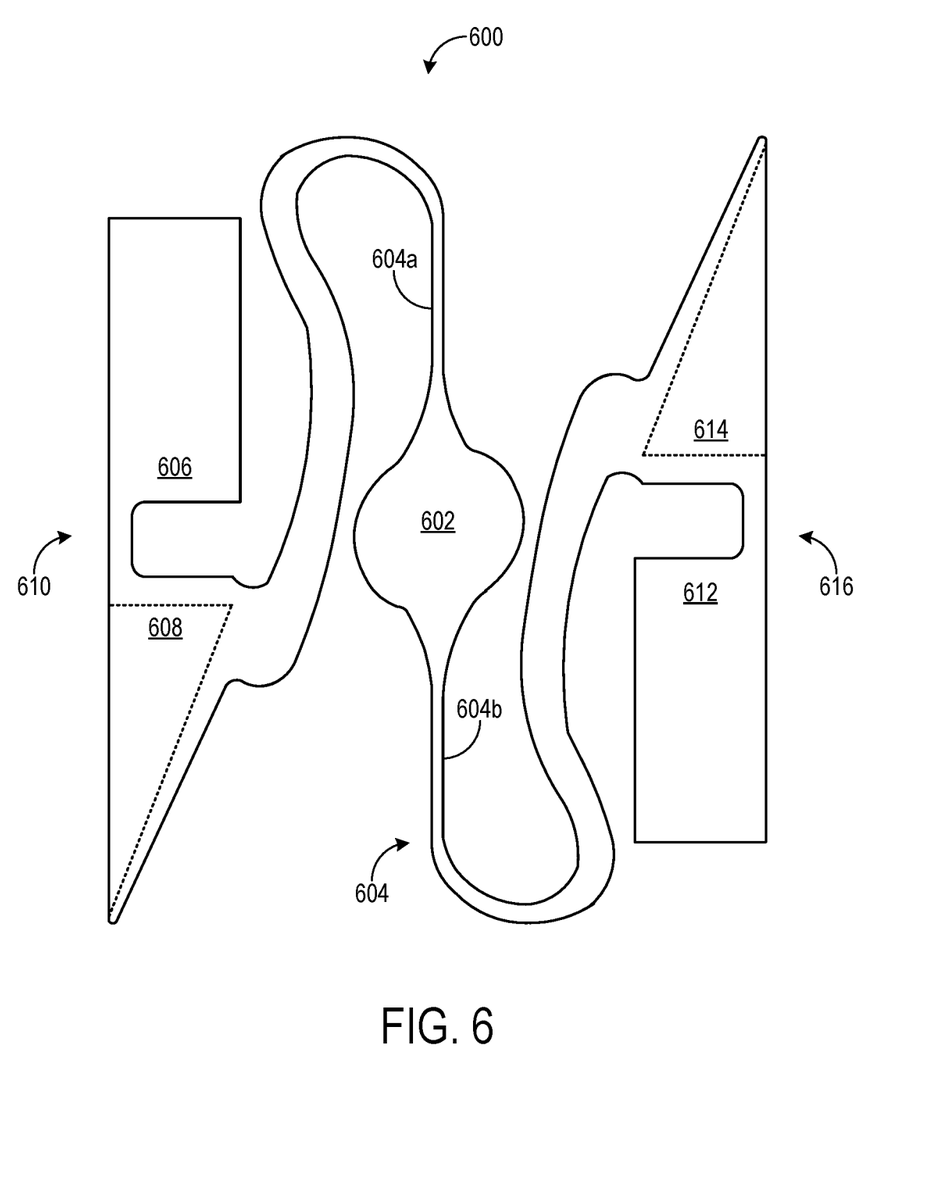
FIG. 6 shows another example scanning mirror system.

FIG. 6 shows another example scanning mirror system 600 including a mirror 602 supported by a flexure 604, which comprises a first flexure portion 604a and a second flexure portion 604b. Scanning mirror system 600 also includes a first anchor 606 and a first actuator 608 located at a first lateral side 610 of the scanning mirror system, and a second anchor 612 and a second actuator 614 located at a second lateral side 616 opposite the first lateral side. As compared to scanning mirror system 300 of FIG. 3, the longitudinal ends to which the anchors and actuators of scanning mirror system 600 are proximate are opposite the longitudinal ends to which the anchors and actuators of scanning mirror system 300 are proximate. As a result, the length of flexure 604 is relatively greater than that of flexure 304. This relatively greater length may result in a comparatively greater magnitude of mechanical amplification of motion of mirror 602, as well as a comparatively reduced degree of stress experienced by flexure 304.

Figure 7:
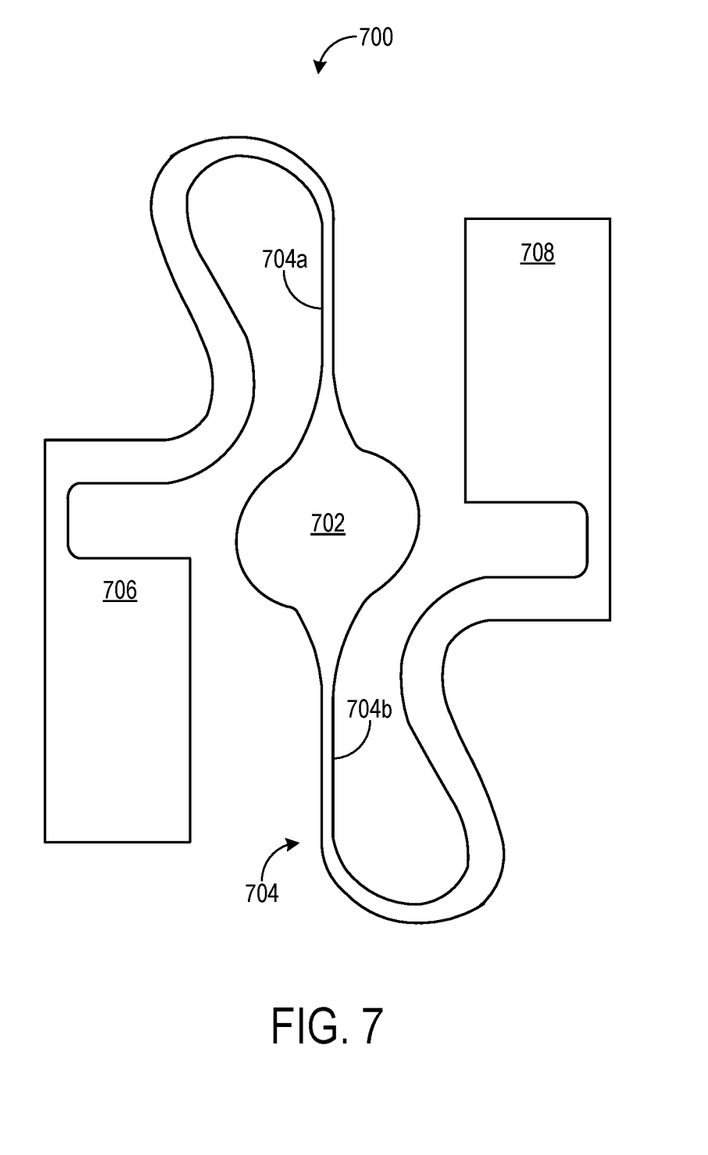
FIG. 7 shows another example scanning mirror system.

FIG. 7 shows another example scanning mirror system 700 including a mirror 702 supported by a flexure 704. Flexure 704 comprises a first flexure portion 704a extending from a first anchor 706, and a second flexure portion 704b extending from a second anchor 708. Scanning mirror system 700 lacks an integrated actuator system. Instead, an external actuator system (not shown in FIG. 7) may be operatively coupled to scanning mirror system 700 and configured to actuate flexure 704 to thereby rotate mirror 702. Any suitable type of external actuator system may be used, including but not limited electromagnetic and electrostatic actuator systems.

Another example provides a display device comprising a light source, a support structure, and a scanning mirror system coupled to the support structure and configured to scan light from the light source to form a displayed image, the scanning mirror system comprising a mirror, a first anchor located at a first lateral side of the scanning mirror system, and a second anchor located at a second lateral side of the scanning mirror system, each of the first anchor and the second anchor coupled to the support structure, a flexure supporting the mirror, the flexure comprising a first portion extending from the first anchor toward a first longitudinal end of the scanning mirror system and turning to meet a first end of the mirror, and a second portion extending from the second anchor toward a second longitudinal end of the scanning mirror system opposite the first longitudinal end and turning to meet to a second end of the mirror opposite the first end, and an actuator system configured to actuate the flexure to thereby vary a scan angle of the mirror. In such an example, the actuator system may comprise one or more piezoelectric actuators. In such an example, the actuator system alternatively or additionally may comprise one or more of an electrostatic actuator and an electromagnetic actuator. In such an example, the actuator system alternatively or additionally may comprise a first actuator located at the first lateral side of the scanning mirror system, and a second actuator located at the second lateral side of the scanning mirror system. In such an example, the display device alternatively or additionally may comprise a sensor configured to sense strain of the flexure, the first sensor located at the first anchor. In such an example, the mirror may comprise an elliptical shape. In such an example, the support structure may comprise a circuit board, and the scanning mirror system may be electrically coupled to the circuit board via one or more wire bonds. In such an example, each of the first portion and the second portion of the flexure alternatively or additionally may define a respective gap that extends inwardly from an outer perimeter of the scanning mirror system.

Another example provides a scanning mirror system comprising a mirror, a first anchor located at a first lateral side of the scanning mirror system, and a second anchor located at a second lateral side of the scanning mirror system, a flexure supporting the mirror, the flexure comprising a first portion extending from the first anchor toward a first longitudinal end of the scanning mirror system and turning to meet a first end of the mirror, and a second portion extending from the second anchor toward a second longitudinal end of the scanning mirror system opposite the first longitudinal end and turning to meet to a second end of the mirror opposite the first end, and an actuator system configured to actuate the flexure to thereby vary a scan angle of the mirror. In such an example, the actuator system may comprise one or more piezoelectric actuators. In such an example, the actuator system alternatively or additionally may comprise one or more of an electrostatic actuator and an electromagnetic actuator. In such an example, the actuator system alternatively or additionally may comprise a first actuator located at the first lateral side of the scanning mirror system, and a second actuator located at the second lateral side of the scanning mirror system. In such an example, the scanning mirror system alternatively or additionally may comprise a sensor configured to sense strain of the flexure, the first sensor located at the first anchor. In such an example, the mirror may comprise an elliptical shape. In such an example, each of the first portion and the second portion of the flexure alternatively or additionally may define a respective gap that extends inwardly from an outer perimeter of the scanning mirror system.

Another example provides a scanning mirror system comprising a mirror, a first anchor located at a first lateral side of the scanning mirror system, and a second anchor located at a second lateral side of the scanning mirror system, a flexure supporting the mirror, the flexure comprising a first portion extending from the first anchor toward a first longitudinal end of the scanning mirror system and turning to meet a first end of the mirror, and a second portion extending from the second anchor toward a second longitudinal end of the scanning mirror system opposite the first longitudinal end and turning to meet to a second end of the mirror opposite the first end, and a thin-film piezoelectric actuator system configured to actuate the flexure to thereby vary a scan angle of the mirror. In such an example, the mirror, first anchor, the second anchor, and the flexure may be unitary. In such an example, the piezoelectric actuator system may comprise a first actuator located at the first lateral side of the scanning mirror system, and a second actuator located at the second lateral side of the scanning mirror system. In such an example, the first actuator and the second actuator may comprise patterned portions of a common thin film. In such an example, the mirror may comprise an elliptical shape.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device, comprising:
a light source;
a support structure; and
a scanning mirror system coupled to the support structure and configured to scan light from the light source to form a displayed image, the scanning mirror system comprising
a mirror;
a first anchor located at a first lateral side of the scanning mirror system, and a second anchor located at a second lateral side of the scanning mirror system, each of the first anchor and the second anchor coupled to the support structure;
a flexure supporting the mirror, the flexure comprising
a first portion extending from the first anchor toward a first longitudinal end of the scanning mirror system and turning to meet a first end of the mirror, the first portion defining a first gap between the first portion and a first actuator; and
a second portion extending from the second anchor toward a second longitudinal end of the scanning mirror system opposite the first longitudinal end and turning to meet to a second end of the mirror opposite the first end, the second portion defining a second gap between the second portion and a second actuator; and
an actuator system comprising the first actuator and the second actuator, the actuator system configured to actuate the flexure to thereby vary a scan angle of the mirror.

2. The display device of claim 1, wherein the actuator system comprises one or more piezoelectric actuators.

3. The display device of claim 1, wherein the actuator system comprises one or more of an electrostatic actuator and an electromagnetic actuator.

4. The display device of claim 1, further comprising a sensor configured to sense strain of the flexure, the first sensor located at the first anchor.

5. The display device of claim 1, wherein the mirror comprises an elliptical shape.

6. The display device of claim 1, wherein the support structure comprises a circuit board, and wherein the scanning mirror system is electrically coupled to the circuit board via one or more wire bonds.

7. The display device of claim 1, wherein each of the first gap and the second gap extend inwardly from an outer perimeter of the scanning mirror system.

8. A scanning mirror system, comprising:
- a mirror;
- a first anchor located at a first lateral side of the scanning mirror system, and a second anchor located at a second lateral side of the scanning mirror system;
- a flexure supporting the mirror, the flexure comprising
    - a first portion extending from the first anchor toward a first longitudinal end of the scanning mirror system and turning to meet a first end of the mirror, the first portion defining a first gap between the first portion and a first actuator; and
    - a second portion extending from the second anchor toward a second longitudinal end of the scanning mirror system opposite the first longitudinal end and turning to meet to a second end of the mirror opposite the first end, the second portion defining a second gap between the second portion and a second actuator; and
- an actuator system comprising the first actuator and the second actuator, the actuator system configured to actuate the flexure to thereby vary a scan angle of the mirror.

9. The scanning mirror system of claim 8, wherein the actuator system comprises one or more piezoelectric actuators.

10. The scanning mirror system of claim 8, wherein the actuator system comprises one or more of an electrostatic actuator and an electromagnetic actuator.

11. The scanning mirror system of claim 8, further comprising a sensor configured to sense strain of the flexure, the first sensor located at the first anchor.

12. The scanning mirror system of claim 8, wherein the mirror comprises an elliptical shape.

13. The scanning mirror system of claim 8, wherein each of the first gap and the second gap extend inwardly from an outer perimeter of the scanning mirror system.

14. A scanning mirror system, comprising:
- a mirror;
- a first anchor located at a first lateral side of the scanning mirror system, and a second anchor located at a second lateral side of the scanning mirror system;
- a flexure supporting the mirror, the flexure comprising
    - a first portion extending from the first anchor toward a first longitudinal end of the scanning mirror system and turning to meet a first end of the mirror, the first portion defining a first gap between the first portion and a first actuator; and
    - a second portion extending from the second anchor toward a second longitudinal end of the scanning mirror system opposite the first longitudinal end and turning to meet to a second end of the mirror opposite the first end, the second portion defining a second gap between the second portion and a second actuator; and
- a thin-film piezoelectric actuator system comprising the first actuator and the second actuator, the thin-film piezoelectric actuator system configured to actuate the flexure to thereby vary a scan angle of the mirror.

15. The scanning mirror system of claim 14, wherein the mirror, first anchor, the second anchor, and the flexure are unitary.

16. The scanning mirror system of claim 14, wherein the first actuator and the second actuator comprise patterned portions of a common thin film.

17. The scanning mirror system of claim 14, wherein the mirror comprises an elliptical shape.

* * * * *